(12) United States Patent
Tsai

(10) Patent No.: US 6,521,971 B2
(45) Date of Patent: Feb. 18, 2003

(54) METAL FUSE IN COPPER DUAL DAMASCENE

(75) Inventor: Chao-Chieh Tsai, Shin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 16 days.

(21) Appl. No.: 09/932,681

(22) Filed: Aug. 20, 2001

(65) Prior Publication Data

US 2001/0054745 A1 Dec. 27, 2001

Related U.S. Application Data

(62) Division of application No. 09/473,026, filed on Dec. 28, 1999, now Pat. No. 6,295,721.

(51) Int. Cl.[7] .............................................. H01L 29/00
(52) U.S. Cl. ...................................... 257/529; 257/758
(58) Field of Search ................................. 257/529, 209, 257/758; 438/132, 215, 333, 601

(56) References Cited

U.S. PATENT DOCUMENTS

| | | | |
|---|---|---|---|
| 5,589,706 A | 12/1996 | Mitwalsky et al. | 257/529 |
| 5,729,041 A | 3/1998 | Yoo et al. | 257/529 |
| 5,757,060 A | 5/1998 | Lee et al. | 257/529 |
| 5,776,826 A | 7/1998 | Mitwalsky et al. | 438/622 |
| 5,795,819 A | 8/1998 | Motsiff et al. | 438/618 |
| 5,801,094 A | 9/1998 | Yew et al. | 438/624 |
| 5,926,697 A | 7/1999 | Yaung et al. | 438/132 |
| 6,033,939 A | * 3/2000 | Agarwala et al. | |
| 6,100,118 A | * 8/2000 | Shih et al. | |
| 6,261,937 B1 | * 7/2001 | Tabben et al. | |
| 6,444,503 B1 | * 9/2002 | Yu | |

* cited by examiner

Primary Examiner—Sheila V. Clark
(74) Attorney, Agent, or Firm—George O. Saile; Stephen B. Ackerman

(57) ABSTRACT

A fuse structure and process for forming it are described. The fuse is formed from a compound layer of aluminum and chromium. These two layers are shaped to form a stripe that bridges a gap between two copper dual damascene connectors. By controlling the degree of overlap between the stripe and the connectors the conductance of heat from the stripe into the connectors can be varied, thereby allowing control of the manner in which the fuse blows when irradiated. Since there is no copper in the fuse material, blowing a fuse does not introduce unprotected copper sources into the structure.

9 Claims, 4 Drawing Sheets

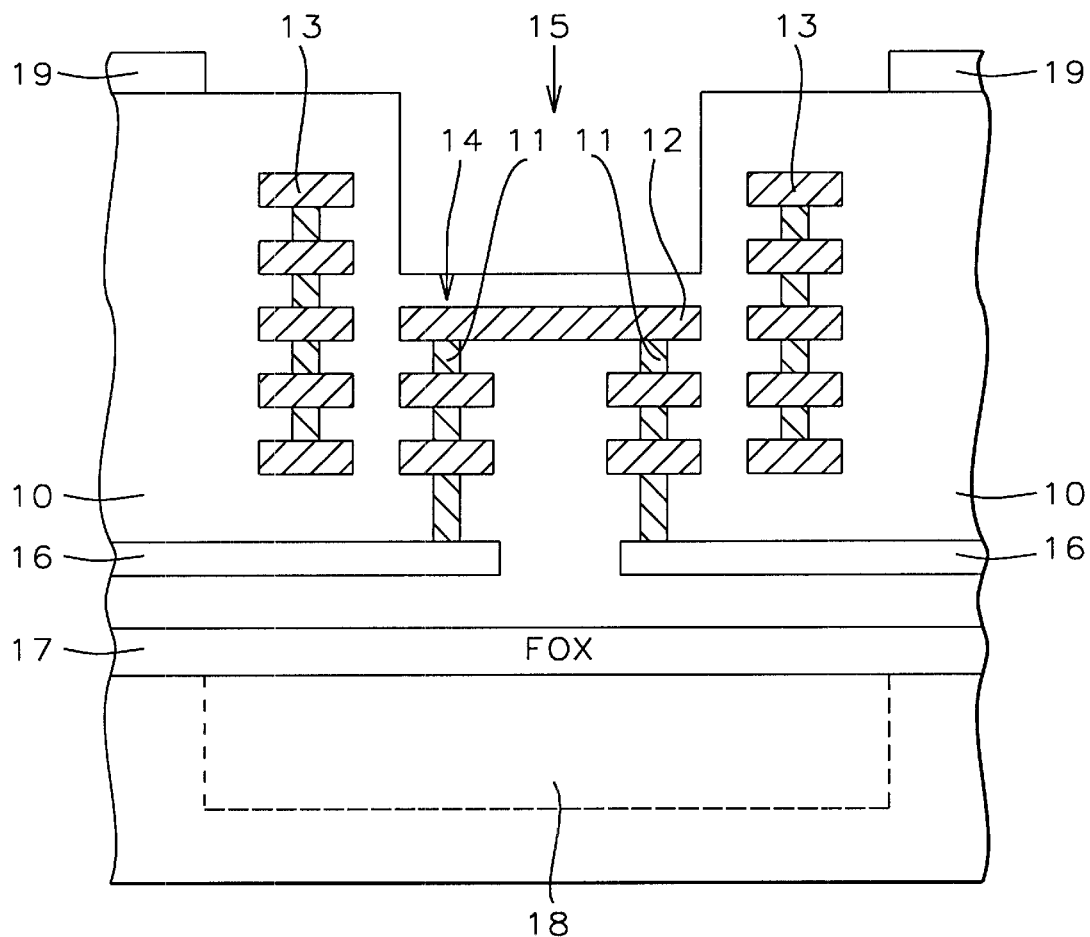
FIG. 1 – Prior Art
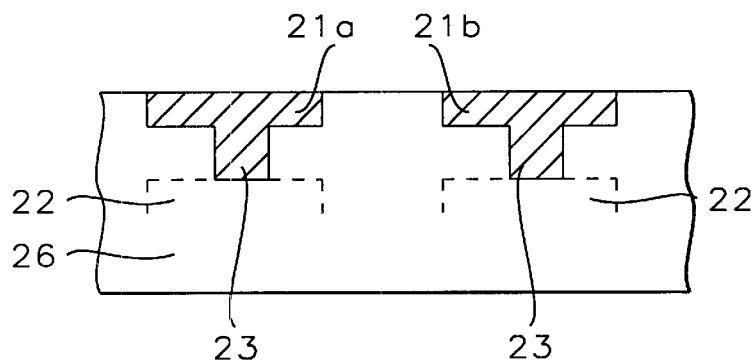
FIG. 2

METAL FUSE IN COPPER DUAL DAMASCENE

This is a division of patent application Ser. No. 09/473,026, filing date Dec. 28, 1999 U.S. Pat. No. 6,295,721, Metal Fuse In Copper Dual Damascene, assigned to the same assignee as the present invention.

FIELD OF THE INVENTION

The invention relates to the general field of silicon integrated circuits with particular reference to controlled breaking of connections.

BACKGROUND OF THE INVENTION

Where circuit density and performance do not have to be fully maximized in an integrated circuit, it is sometimes found expedient to include in the circuit design additional connections, within the circuit wiring, that can be severed, as desired, at a later stage of the manufacturing process. In this way the circuit can be either repaired by removing bad components (assuming redundancy has been built into the system) or, more generally, a set of general purpose circuits can be personalized to perform any of a range of specific functions.

With the advent of the copper damascene process, it has been a natural step to make the fuses out of copper since making the fuse could be combined with making normal wiring. An example of such a prior art structure is schematically illustrated in FIG. 1. A layer of field oxide 17 is seen to be covering a silicon substrate including, primarily, a P-well 18. The two fragments 16a and 16b of polysilicon wiring would normally be connected to two electrically separate devices but in the fuse arrangement, each is upwardly connected to three levels of dual damascene structures 11 that are embedded in dielectric 10. These share a common trench (or stripe) portion 12 at their topmost level. This shared topmost level of damascene wiring can thus be used as a fuse.

In order to make connecting copper stripe 12 fusible under the influence of externally directed radiation, most of dielectric material 10 directly above 11 is etched away to form fuse cavity 12. A small thickness (typically about 8,000 Angstroms) 14 of dielectric is left in place. This residual layer is thick enough to passivate the copper while at the same time being thin enough to allow the fusing beam to pass through with minimum attenuation as well as being thin enough to disintegrate when the fuse is blown i.e. when 12 becomes discontinuous.

There are several problems associated with this method of making a fusible connection within a copper damascene technology. Because copper is a good thermal conductor and because it has a relatively high melting point, the energy needed to fuse the copper is relatively high—typically about 10 microjoules. This makes copper fuses incompatible with existing laser fusing technologies that were developed prior to the wholesale introduction of the copper damascene technology.

An additional problem associated with copper fuses has been the poor passivation qualities of copper oxide. The latter forms on the bottom surface of window 15 after the fuse has been blown and provides a ready source of copper that can rapidly diffuse through the dielectric down to the silicon devices level where it 'poisons' them. Of course, the original damascene structure of which the fuse was a part included barrier layers (not shown) that isolated the copper from all other materials, but these protective layers are no longer present in the vicinity of a blown fuse.

Also seen in FIG. 1 is guard ring 13. This is series of dummy dual damascene structures that form a ring completely surrounding fuse cavity 15. Its purpose is to terminate the propagation of cracks in dielectric 10 that may appear after a fuse has been blown. While microcracks will propagate relatively easily through the hard and brittle dielectric, they cease to grow once they encounter the soft metal of the guard ring. We have shown the guard ring for the sake of completeness and, although it is advisable to use one in conjunction with a fuse structure, it has no direct bearing on the present invention.

A routine search of the prior art was conducted but no references teaching the exact process or structure of the present invention were found. Several prior art references that were encountered were, however, found to be of interest. For example, in U.S. Pat. No. 5,801,094, Yew et al. show a copper dual damascene method.

Mitwalsky et al. In U.S. Pat. No. 5,776,826 show a fuse in an upper level metal layer and introduce an extra level of metal below the fuse to prevent propagation of cracks that might form when a fuse is blown. This essentially the protection ring mentioned above.

In U.S. Pat. No. 5,795,819 Motsiff et al. describe a process in which the same material is used for both a C4 barrier layer and a fuse. Aluminum is mentioned as one of the materials which can be used in this way. It is, however, important to note that there is no other material present between the aluminum and the copper. As will be seen, the present invention teaches the importance of inserting another metal, such as chromium, between the aluminum and the copper.

In U.S. Pat. No. 5,589,706 Mitwalsky et al. show a fuse link and dummy structures for dual damascene process and BEOL (back end of line). Lee et al. (in U.S. Pat. No. 5,757,060,) and Yaung et al. (in U.S. Pat. No. 5,926,697) show a guard rings around a fuse while in U.S. Pat. No. 5,729,041, Yoo et al. show a protective film for a fuse window.

SUMMARY OF THE INVENTION

It has been an object of the present invention to provide a fuse structure that is fully compatible with copper damascene technology.

Another object of the present invention has been that said fuse structure also be fully compatible with current (pre-damascene) fusing methods.

A still further object has been that said fuse structure not be susceptible to copper contamination after a fuse has been blown.

Yet another object of the invention has been to provide a process for manufacturing said fuse structure.

These objects have been achieved by forming the fuse from a compound layer of aluminum and chromium. These two layers are shaped to form a stripe that bridges a gap between two dual damascene connectors. By controlling the degree of overlap between the stripe and the connectors the conductance of heat from the stripe into the connectors can be varied thereby allowing control of the manner in which the fuse blows when irradiated. Since there is no copper in the fuse material, blowing a fuse does not introduce unprotected copper sources into the structure.

BRIEF DESCRIPTION OF THE DRAWINGS

FIG. 1 is a cross-section of a fuse structure of the prior art in which dual damascene copper connectors have been used and in which the fuse is also made of copper.

FIG. 2 is a cross-section showing the starting point for implementing the process of the present invention.

FIG. 6 is a plan view of which FIG. 5 is a cross-section.

DESCRIPTION OF THE PREFERRED EMBODIMENTS

We will disclose the present invention by describing the process for manufacturing a fuse. In the course of doing so, the structure of the fuse will also become evident. Referring now to FIG. 2, the process begins with the provision of a partially completed integrated circuit, a portion of whose connection wiring is shown in the figure as dielectric 26 in which are embedded two dual damascene structures each of which is made up of a stud (or via) part 23 and upper trench (or wiring channel) parts 21a and 21b. The latter are flush with the surface of 26, are fully exposed, and are separated by a gap of between about 4 and 10 microns. In general, there will be one or more additional dual damascene structures (symbolized as 22) that extend downwards to make contact at some level further down.

Figure 3:
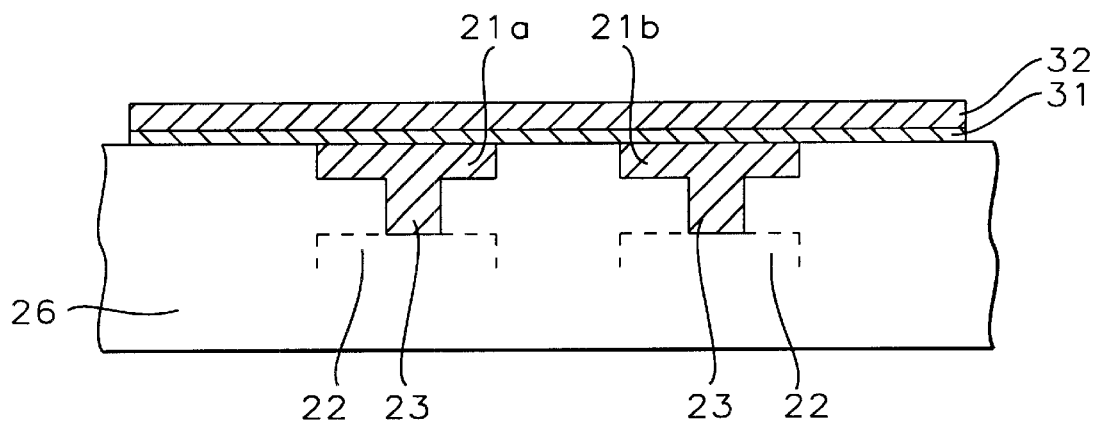
FIGS. 3 and 4 illustrate additional steps in the process of the invention.

Referring next to FIG. 3, the next step in the process is the deposition of a layer of chromium 31 on the upper surface of the structure seen in FIG. 2. The introduction of this layer is the result of experiments that we performed which have shown that interaction between aluminum and copper over time leads eventually to less than optimum performance of the former when it is used as a fuse. It is thus a key feature of the invention. Its thickness is between about 200 and 500 Angstroms. This is followed by the deposition of aluminum layer 32 over chromium layer 31 to a thickness between about 0.2 and 0.4 microns.

With these two layers in place, standard photolithographic techniques are used to pattern them into the shape of a stripe that has the same width as the exposed dual damascene connectors (between about 0.8 and 2 microns) which it overlaps at both inside edges, extending no further than the outside edges of 21a and 21b.

Figure 4:
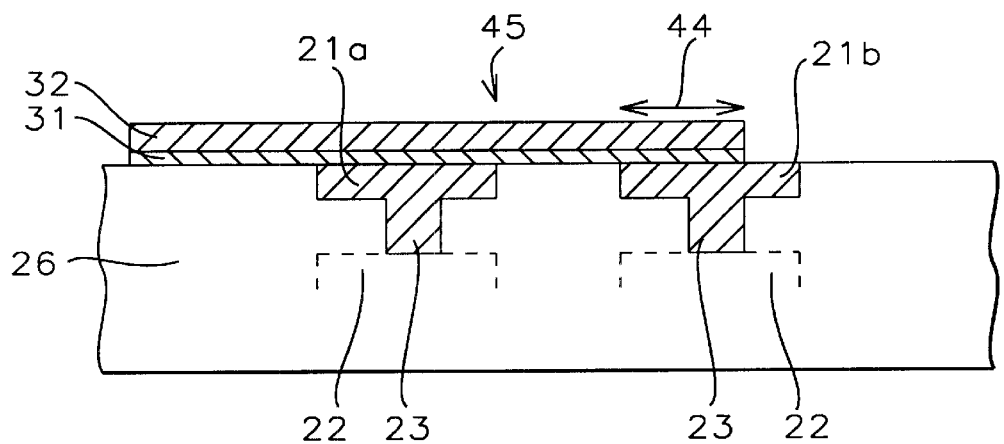

This is shown in FIG. 4. The amount that the stripe 45 overlaps the connectors is an important parameter and is another key feature of the invention. In the example shown in FIG. 4, stripe 45 is shown as fully overlapping 21a and partially overlapping 21b by an amount 44. The extent to which overlap (on either or both sides) occurs will determine the conductance of heat between the stripe and the dual damascene connectors 21a and 21b. This, in turn, will influence the behavior of the stripe when it is irradiated with a view to making it discontinuous (i.e. blowing the fuse). In general the amount of overlap will range from between about 0.4 and 2 microns on one side and between about 0.4 and 2 microns on the other side.

Figure 5:
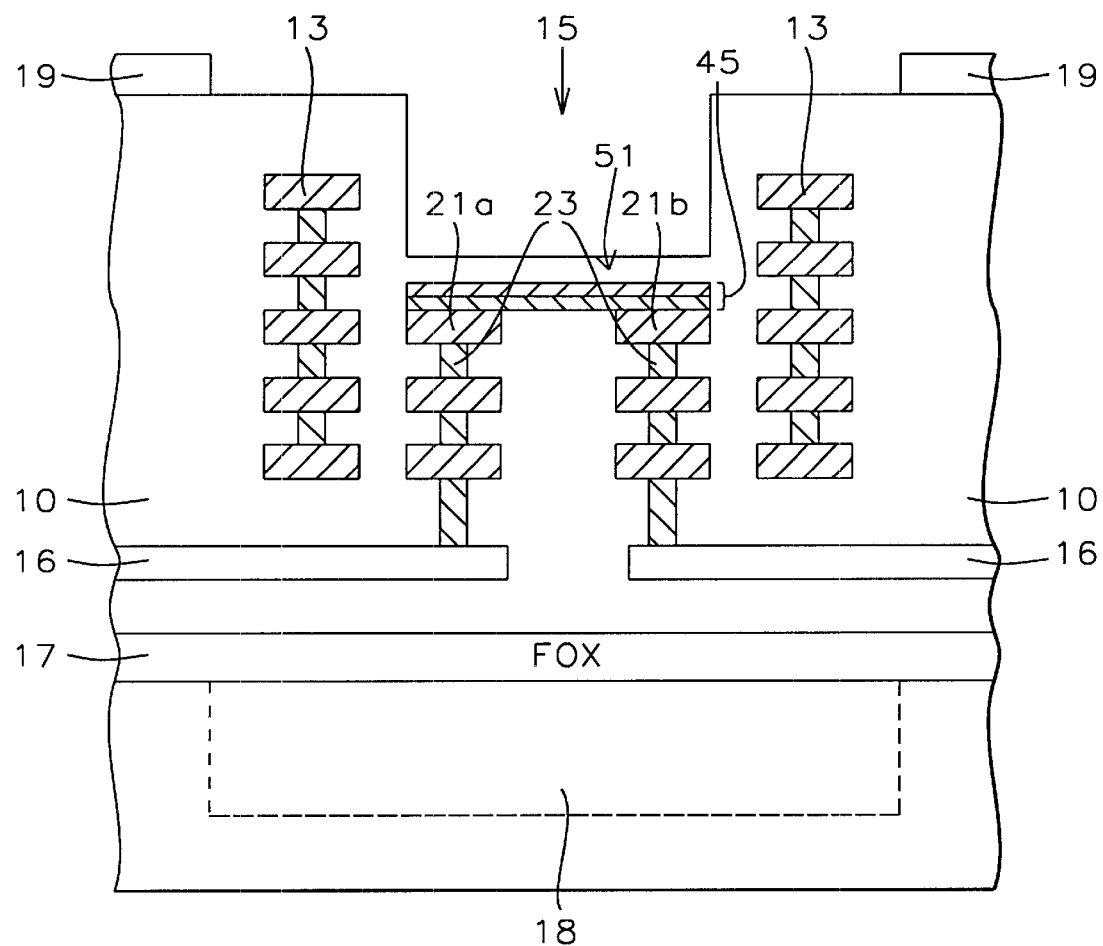
FIG. 5 is a cross-section of the fuse structure of the present invention.

The fuse, per se, requires only the presence of a passivation layer that is thick enough to protect it from outside contaminants and thin enough to allow material from the fuse to escape when it is blown. In practice, however, the integrated circuit will be completed with the deposition of additional dielectric layers in which are embedded additional dual damascene structures. This is illustrated in FIG. 5 which shows fuse cavity 15 which has been formed by etching downwards into the additional dielectric material until only a relatively thin layer of dielectric 51 (between about 0.4 and 1.2 microns thick) remains to serve as the fuse window. Typically the depth of fuse cavity 15 will be between about 4 and 6 microns while its width that will be between about 10 and 20 times that of fusible stripe 45 and its length will be between about 4 and 10 times that of the gap.

Figure 6:
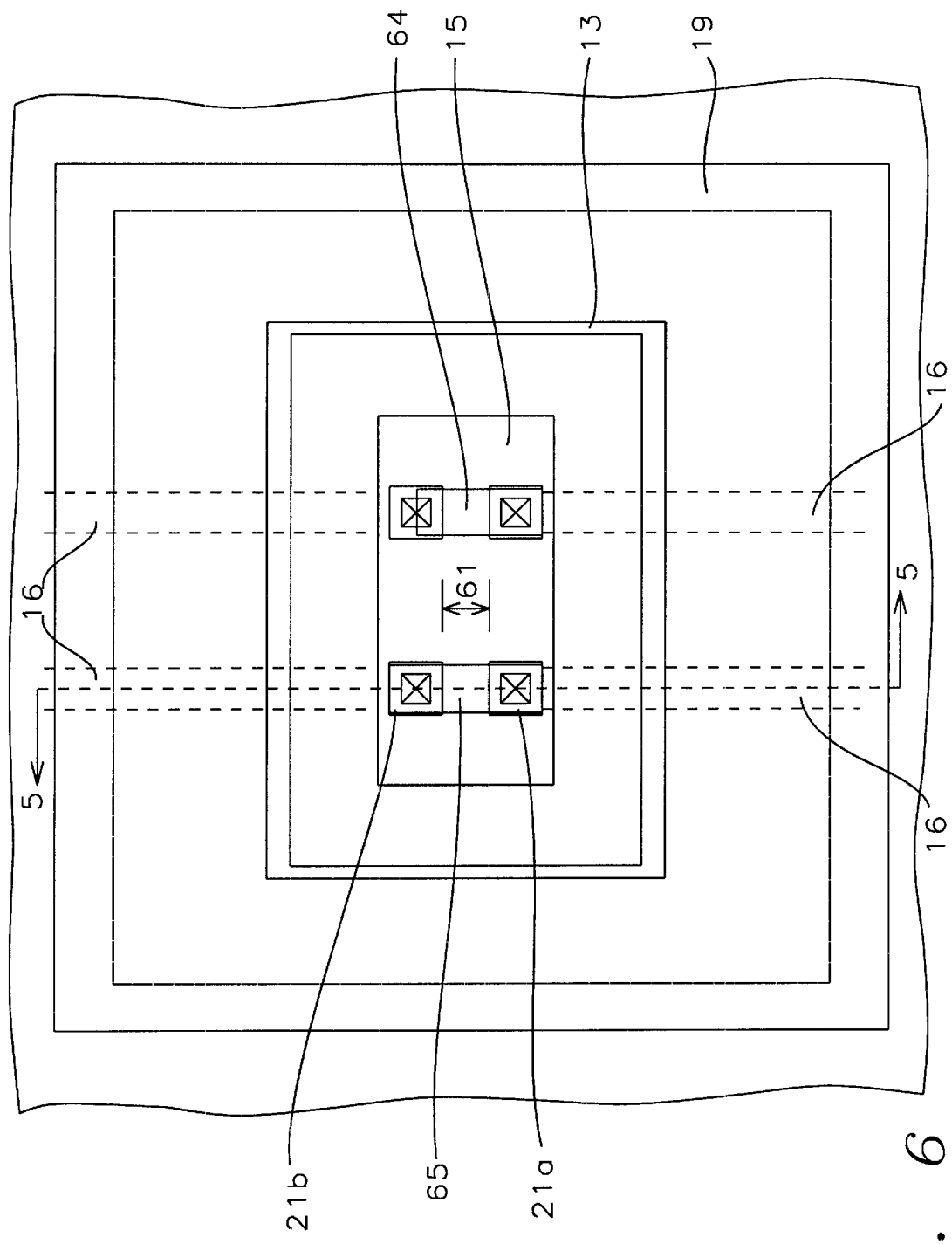

FIG. 6 is a plan view of the structure of which FIG. 5 is a cross-section taken at 5—5. In this case fuse cavity 15 is shared between two fuses 64 and 65 each of which bridges a gap of length 61. The precise number of fuses that share a particular fuse cavity has no bearing on the operation of the invention.

In order to blow a particular fuse, a beam of radiation (typically a laser at a wavelength of 1,321 nm ) is directed through the fuse window at the fusible stripe. Because the fuse material has a lower melting point than copper and because heat conductance out of the stripe is carefully controlled (as discussed above), significantly less energy to blow the fuse is required. Thus, when irradiating with a beam whose cross-sectional area at the fusible stripe is between about 20 and 40 sq. microns, a single pulse whose total energy content is between about 0.2 and 0.85 microjoules is sufficient to blow the fuse. Additionally, fuses of this type cannot introduce any sources of unprotected copper into the structure.

While the invention has been particularly shown and described with reference to the preferred embodiments thereof, it will be understood by those skilled in the art that various changes in form and details may be made without departing from the spirit and scope of the invention.

What is claimed is:

1. A fuse structure, comprising:
    a partially completed integrated circuit having a first dielectric upper surface in which are embedded first and second dual damascene connectors, each having a width and each having an inner edge and an outer edge, said inner edges being separated by a gap having a length;
    a layer of chromium on said upper surface, in contact with the dual damascene connectors, and a layer of aluminum over the layer of chromium, said aluminum and chromium layers having the shape of a stripe, that has said width, and that extends no further than said outer edges and that overlaps the first inner edge by a first amount and the second inner edge by a second amount;
    additional dielectric layers above the first dielectric surface, including the stripe, in which are embedded additional dual damascene structures; and
    a fuse cavity above the fusible stripe that extends through all of said additional dielectric layers except for a residual thickness of dielectric material that serves as a fuse window.

2. The structure of claim 1 wherein the residual thickness of dielectric material that serves as a fuse window is between about 0.4 and 1.2 microns.

3. The structure of claim 1 wherein the first amount of overlap of the first inner edge by the fusible stripe is between about 0.4 and 2 microns and the second amount of overlap of the second inner edge by the fusible stripe is between about 0.4 and 2 microns.

4. The structure of claim 1 wherein the fuse cavity has depth between about 4 and 6 microns.

5. The structure of claim 1 wherein the fuse cavity has width that is between about 4 and 10 times the width of the fusible stripe and a length that is between about 10 and 20 times the length of the gap.

6. The structure of claim 1 wherein the fusible stripe can be made discontinuous through irradiation with a pulse of radiation applied as a beam whose total energy content is between about 0.2 and 0.85 microjoules and whose cross-sectional area at the fusible stripe is between about 20 and 40 sq. microns.

7. The structure of claim 1 wherein the layer of chromium has a thickness between about 200 and 500 Angstroms.

8. The structure of claim 1 wherein the layer of aluminum has a thickness between about 2,000 and 4,000 Angstroms.

9. The structure of claim 1 wherein the width of the fusible stripe is between about 0.8 and 1.2 microns and the length of the gap is between about 4 and 20 microns.

* * * * *